US012584974B2

(12) United States Patent
Ridder et al.

(10) Patent No.: US 12,584,974 B2
(45) Date of Patent: Mar. 24, 2026

(54) DEVICE FOR DETERMINING CELL VOLTAGES ACROSS SERIES-CONNECTED BATTERY CELLS AND METHOD FOR DETERMINING CELL VOLTAGES

(71) Applicant: Vitesco Technologies Germany GmbH, Regensburg (DE)

(72) Inventors: Matthias Ridder, Eckental (DE); Magnus Jaster, Jaster (DE)

(73) Assignee: VITESCO TECHNOLOGIES GMBH, Regenburg (DE)

( * ) Notice: Subject to any disclaimer, the term of this patent is extended or adjusted under 35 U.S.C. 154(b) by 245 days.

(21) Appl. No.: 18/448,231

(22) Filed: Aug. 11, 2023

(65) Prior Publication Data

US 2023/0384394 A1 Nov. 30, 2023

Related U.S. Application Data

(63) Continuation of application No. PCT/EP2022/053799, filed on Feb. 16, 2022.

(30) Foreign Application Priority Data

Feb. 17, 2021 (DE) .......................... 102021201526.3

(51) Int. Cl.
*G01R 31/396* (2019.01)
*G01R 31/3835* (2019.01)

(52) U.S. Cl.
CPC ....... *G01R 31/396* (2019.01); *G01R 31/3835* (2019.01)

(58) Field of Classification Search
CPC .......................... G01R 31/396; G01R 31/3835
See application file for complete search history.

(56) References Cited

U.S. PATENT DOCUMENTS 6,362,627 B1 * 3/2002 Shimamoto ............ G01R 19/25
324/73.1
6,437,538 B1 8/2002 Tsurumi
(Continued)

FOREIGN PATENT DOCUMENTS

DE 10051984 A1 6/2001
DE 102009016259 A1 10/2009
(Continued)

OTHER PUBLICATIONS

International Search Report and Written Opinion dated May 25, 2022 from corresponding International Patent Application No. PCT/EP2022/053799.

(Continued)

*Primary Examiner* — Walter L Lindsay, Jr.
*Assistant Examiner* — Milton Gonzalez

(57) ABSTRACT

A device for determining cell voltages across series-connected battery cells of a cell stack is provided. The battery cells are combined to form packs having a plurality of series-connected battery cells. Each pack has an associated voltage measuring device for determining the cell voltages of the individual battery cells of the respective corresponding pack. The device has a voltage follower for at least two adjacent packs, which is connected to the current path between the two adjacent packs and receives a potential of the one pack as input signal, and also a reference voltage, and provides a supply voltage for the voltage measuring device of the other pack at low impedance as output signal.

10 Claims, 4 Drawing Sheets

(56)          References Cited

U.S. PATENT DOCUMENTS

| | | | | |
|---|---|---|---|---|
| 7,864,090 | B2 * | 1/2011 | Yamamoto | H03M 1/1033 |
| | | | | 341/118 |
| 8,692,556 | B2 * | 4/2014 | Makihara | G01R 31/3835 |
| | | | | 324/426 |
| 8,786,289 | B2 * | 7/2014 | Sekiguchi | G01R 31/396 |
| | | | | 324/433 |
| 10,778,015 | B2 * | 9/2020 | Mizoguchi | H01M 10/482 |
| 2009/0251103 | A1 | 10/2009 | Yamamoto | |
| 2013/0335096 | A1 | 12/2013 | Hasenkopf | |

FOREIGN PATENT DOCUMENTS

| | | | | |
|---|---|---|---|---|
| DE | 102010040713 | A1 | | 3/2012 |
| DE | 102011005603 | A1 | | 9/2012 |
| JP | 2017175730 | A | * | 9/2017 |

OTHER PUBLICATIONS

German Office Action dated Oct. 20, 2021 for corresponding German Patent Application No. 10 2021 201 526.3.

* cited by examiner

DEVICE FOR DETERMINING CELL VOLTAGES ACROSS SERIES-CONNECTED BATTERY CELLS AND METHOD FOR DETERMINING CELL VOLTAGES

CROSS-REFERENCE TO RELATED APPLICATIONS

This application claims the benefit of PCT Application PCT/EP2022/053799, filed Feb. 16, 2022, which claims priority to German Application 10 2021 201 526.3, filed Feb. 17, 2021. The disclosures of the above applications are incorporated herein by reference.

TECHNICAL FIELD

The disclosure relates to a device and a method for determining cell voltages across series-connected battery cells of a cell stack, for example battery cells of a traction battery of an electrically driven vehicle.

BACKGROUND

Large traction batteries of electrically driven vehicles typically have multiple series-connected packages (packs) of battery cells. Multiple packs can form a cell stack, and a battery can have one or more cell stacks.

Each individual pack is monitored by a control device that is assigned to it. The supply voltage for the control unit is usually provided from the battery cells.

The monitoring of the packs includes, for example, determining cell voltages of the series-connected battery cells. The voltage measuring device used for this can be part of the control device. In addition to the cell voltages, temperatures of the cells can also be determined, for example. All of the devices for monitoring a pack can be accommodated on a circuit board associated with that pack.

SUMMARY

The disclosure provides a device and a method for determining cell voltages across series-connected battery cells of a cell stack, additional connections and supply lines being intended to be dispensed with as far as possible. In addition, very precise voltage measurement is intended to be facilitated.

One aspect of the disclosure provides a device for determining cell voltages across series-connected battery cells of a cell stack. The battery cells being combined to form packs that include a plurality of series-connected battery cells. The device has the following: each pack has an associated voltage measuring device for determining the cell voltages of the individual battery cells of the pack. The device has a voltage follower for at least two adjacent packs, which is connected to the current path between the two adjacent packs and receives a potential of the one pack as input signal, and also a reference voltage, and provides a supply voltage for the voltage measuring device of the other pack at low impedance as output signal.

A cell stack is understood here and below to mean a plurality of battery cells that are arranged in close proximity to one another, for example in a common housing, and that can be connected in series.

As already explained above, a pack of battery cells is understood here and below to mean a plurality of battery cells that can have a common control device. The battery cells of a pack can also be mechanically combined to form a package, for example mechanically connected, and/or arranged together in a housing section. This is not absolutely necessary; however, the battery cells of a pack within the meaning of this disclosure can instead also be arranged physically separately from one another. Each pack at least has an associated voltage measuring device that determines and monitors the cell voltages of all battery cells of the pack. For this purpose, measuring lines are provided on each battery cell.

Adjacent packs are understood to mean packs that follow one another in terms of the power supply, i.e., packs that are connected up in series.

The device facilitates generation of the required supply potentials for the voltage measuring device and possibly further infrastructure for cell management using the measuring lines that are present anyway. This makes it possible to manage with relatively few supply lines and thus to save costs and installation space. For example, only one positive and one negative supply line is required, regardless of the number of series-connected voltage measuring devices.

Since the voltage measurement is intended to be carried out with a high level of accuracy, for example in the millivolt range, the impedance of the connecting lines between the cells and the voltage measuring device can be problematic, since a current flowing from the cells to the voltage measuring device causes a voltage drop that cannot be estimated.

However, the use of a voltage follower provides a low-impedance signal that serves as the supply voltage for the voltage measuring device.

In some implementations, the device has an upstream voltage follower for the voltage follower of each individual pack of the cell stack from the second pack to the last pack of the cell stack. This has the advantage that a precise voltage measurement is possible for all cells of a cell stack. The voltage measuring device of the first pack of the cell stack is connected directly to the supply potential, which supplies the reference voltage for the voltage followers of the subsequent packs.

In some implementations, the at least one voltage follower has a bypass circuit and an amplifier circuit, through which there are alternative flows during operation. This example provides for the impedance conversion by the voltage follower to be performed only when required. If the device for determining the cell voltages is not in operation, for example because the vehicle that is being supplied with power by the battery is not in operation, energy can advantageously be saved by virtue of the voltage measuring devices changing to a sleeping state. No impedance conversion is required by the voltage follower in this sleeping state, however. The amplifier circuit that brings about the impedance conversion would draw energy unnecessarily and is therefore switched to inactive when the voltage measuring device is in the sleeping state, and the bypass circuit is active.

For example, the amplifier circuit can have a power stage having two complementary bipolar transistors, and a base stage having two diodes, which are each connected upstream of the base of the bipolar transistors, with the result that they shift the operating points of the bipolar transistors.

In some implementations, the input signal is amplified by one of the complementary bipolar transistors in each case-by the one bipolar transistor when the input signal is falling and by the complementary bipolar transistor when the input signal is rising. The output signal thus follows the input signal.

Without the base stage, the amplifier circuit would have a dead zone where neither of the bipolar transistors would be on, since the difference between the input and output voltages must always be greater than the on-state voltage. The diodes, which can be in the form of bipolar diodes, for example, compensate for the dead zone.

In some implementations, the at least one voltage follower has an input for an activation signal that can be used to activate the bypass circuit and to deactivate the amplifier circuit when the associated voltage measuring device changes from a waking to a sleeping state.

Accordingly, the activation signal brings about the changeover between the bypass circuit and amplifier circuit through which there are alternative flows. For example, there can be provision for the activation signal to have two levels and for the amplifier circuit to be active at a high level and for the bypass circuit to be active at a low level. For example, the high level can be 5V above the output signal, while the lower level is at the output signal (ground).

Another aspect of the disclosure provides a battery for an electrically operated vehicle. The battery has a number of series-connected cells of a cell stack. The battery cells being combined to form multiple packs including a plurality of series-connected battery cells. The battery also has the described device for determining cell voltages of the series-connected battery cells. Such a battery having such a device for determining cell voltages could also be in the form of a solar battery for storing electrical energy provided by a photovoltaic system, or in the form of some other battery.

The battery may be the traction battery of an electrically driven vehicle, an electrically driven vehicle being understood to mean both a purely electrically operated vehicle and, for example, a hybrid vehicle.

Yet another aspect of the disclosure provides a method for determining cell voltages across the series-connected battery cells of a cell stack The battery cells being combined to form multiple packs having a plurality of series-connected battery cells and each pack having an associated voltage measuring device for determining the cell voltages of the individual battery cells of the respective pack. A voltage signal provided at high impedance from a potential of a pack is used in impedance-converted form, using a reference voltage, as the supply voltage for the voltage measuring device of an adjacent pack.

The impedance conversion in this case can be performed, for example, by a voltage follower.

In some examples, the impedance conversion is only performed when the associated voltage measuring device is in a waking state.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
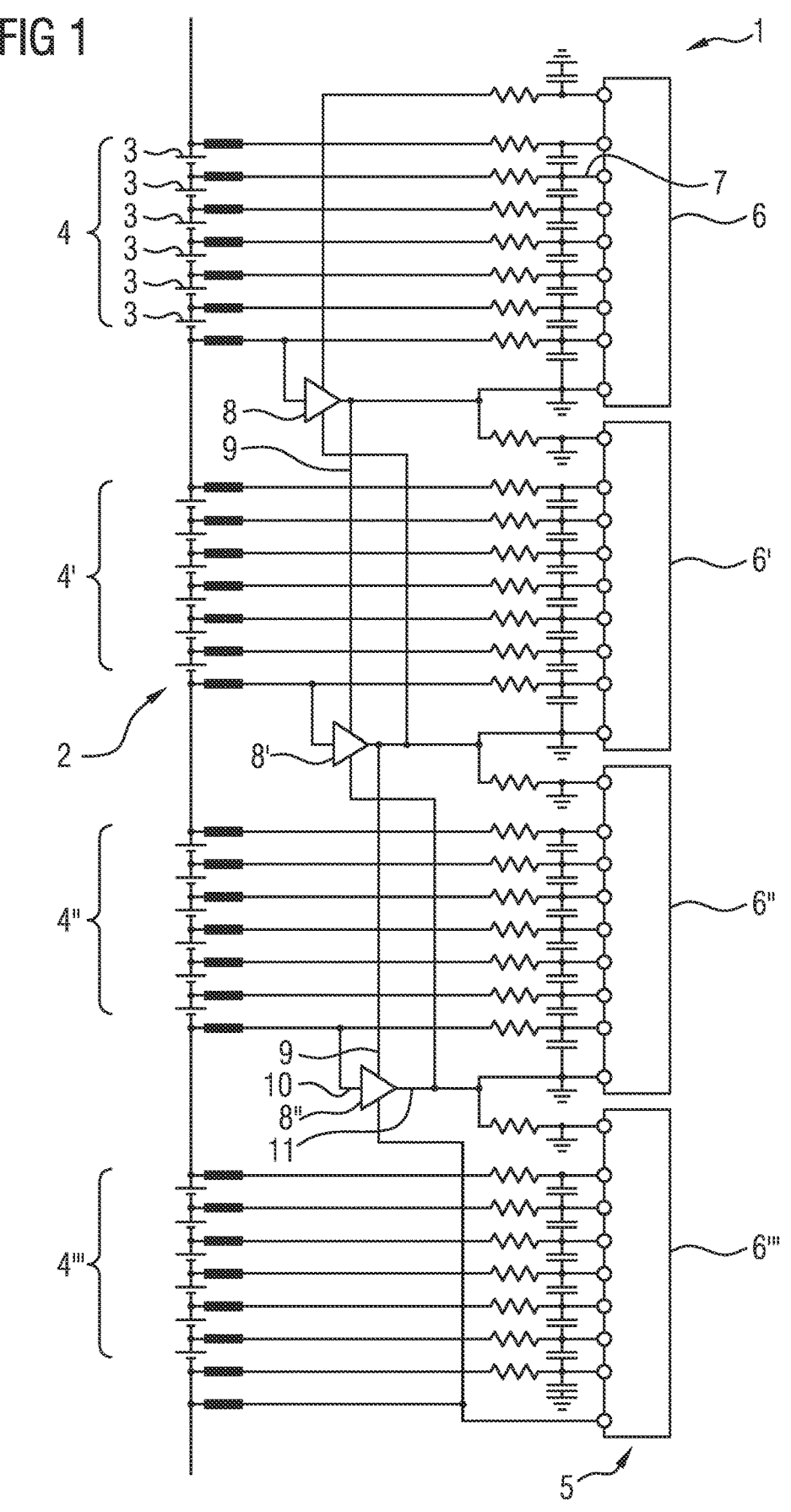
FIG. 1 schematically shows a battery for an electrically operated vehicle.

FIG. 1 schematically shows a battery 1 for an electrically operated vehicle according to an embodiment of the invention. The battery 1 has at least one cell stack 2 consisting of a plurality of battery cells 3 stacked one on top of the other. For the sake of simplicity, FIG. 1 shows only one cell stack 2, such batteries 1 typically having multiple cell stacks 2. As shown, six battery cells 3 are associated with each pack 4, 4', 4", 4'''. The battery cells 3 can be, for example, lithium ion cells or lithium polymer cells or other types of energy storage cells, for example electrochemical capacitors. They are all referred to below as "battery cells" for the sake of simplicity.

The battery cells 3 are connected in series. In order to ensure optimum utilization of the capacities and particularly gentle charging and discharging of the individual battery cells 3, the battery 1 has a device 5 for determining the cell voltages of the series-connected battery cells 3.

The device 5 for determining the cell voltages has at least one voltage measuring device 6, 6', 6", 6''' for each individual pack 4, 4', 4", 4''' for the purpose of determining the cell voltages across the respective associated pack 4, 4', 4", 4'''. The device 5 can also have other components for monitoring the battery cells 3, for example devices for monitoring the temperatures of the battery cells 3.

The respective voltage measuring device 6, 6', 6", 6''' is supplied with voltage by the battery cells 3 of the respective associated pack 4, 4', 4", 4'''. The voltage is tapped via measuring lines 7.

In order to prevent the voltage measurement from being impaired by the voltage drop caused by the input impedances of the measuring lines 7, a voltage follower 8, 8', 8" is provided between each two adjacent packs 4, 4', 4", 4'''. The voltage followers 8, 8' or 8" each receive the potential of the preceding pack 4, 4' or 4" as input signal, and also a reference voltage 9, and provide a supply voltage for the voltage measuring device 6', 6" or 6''' of the subsequent pack 4', 4" or 4''' at low impedance at the output 11.

The design of the voltage followers 8, 8', 8" is described in more detail below with reference to FIGS. 2 to 4.

Figure 2:
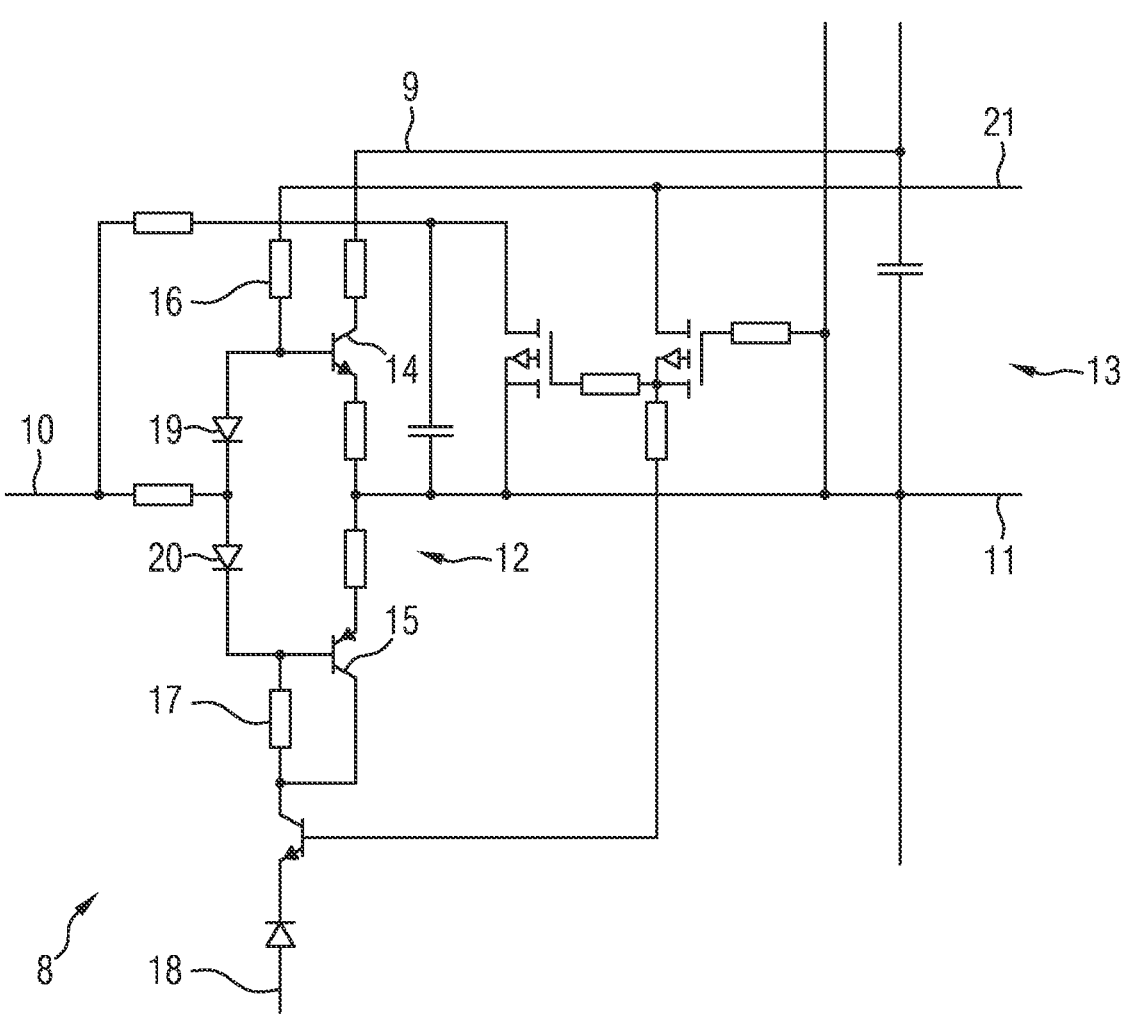
FIG. 2 shows parts of a device for measuring cell voltages across the battery.
Figure 3:
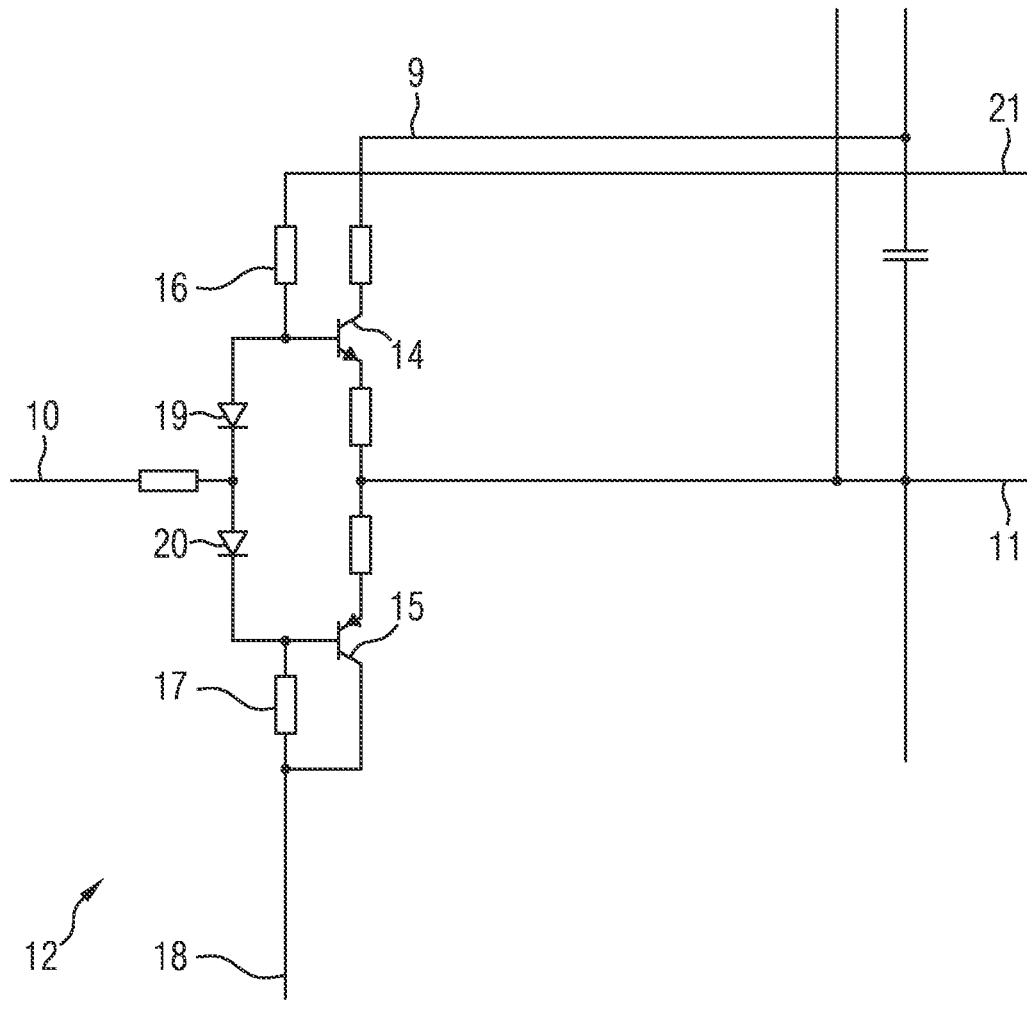
FIG. 3 shows part of a circuit as shown in FIG. 2.

FIG. 2 schematically shows a circuit for the voltage followers 8, 8', 8", only one voltage follower 8 being shown in the figure by way of illustration. FIGS. 3 and 4 each show parts of the circuit shown in FIG. 2. FIG. 3 shows an amplifier circuit of the voltage follower 8 and FIG. 4 shows a bypass circuit of the voltage follower 8.

The circuit of the voltage follower 8 is shown in simplified form in the figures. Components such as resistors are sometimes indicated only schematically. These can be formed by resistors, coils or other components.

The amplifier circuit 12 of the voltage follower 8 includes a high-impedance voltage divider, which is formed by the resistors 16, 17 and provides the voltage present at the input 10 for controlling the power stage. The resistor 16 can be 22 kΩ, for example, and the resistor 17 can be 63 kΩ. The power stage includes, for example, the complementary bipolar transistors 14 and 15, the bipolar transistor 14 having an npn junction and the bipolar transistor 15 having a pnp junction. The power stage has the following function:

If the voltage at the input 10 rises, the control voltage across the power stage rises and a current flows into the base of the bipolar transistor 14. The collector current is equal to the base current multiplied by the current gain, here for example 250-450. The base current thus pulls up the voltage at the output 11 until an equilibrium is established between the base current and the current at the output 11. The current at the output 11 corresponds to the sum of the currents at the input 10 and the reference 9. When the base or emitter voltage of the bipolar transistor 15 rises, no current flows from the output 11 to the negative pole 18 of the supply, since the bipolar transistor 15 is a pnp transistor.

Conversely, when the voltage at the input 10 falls, the bipolar transistor 15 turns on and the bipolar transistor 14 conducts no current. The voltage at the output 11 thus follows the voltage at the input 10.

Without compensation, the power stage containing the bipolar transistors 14 and 15 would have a dead zone of approximately 1.2 V where neither of the transistors 14, 15 would be on, since the difference between the input and output voltages must always be greater than the on-state voltage. As shown, this dead zone is compensated for as a result of the amplifier circuit 12 including upstream diodes 19, 20 that produce a bias for the bipolar transistors 14, 15. Such a bias could also alternatively be achieved by means of other components.

The bias is set such that the base voltage of the bipolar transistor 14 is always 0.6 V higher than the voltage at the input 10 and the base voltage of the bipolar transistor is always 0.6 V lower than the voltage at the input 10.

As shown, the diodes 19, 20 are bipolar diodes whose on-state voltage has the same temperature characteristic as the on-state voltage of the transistors 14, 15.

Figure 4:
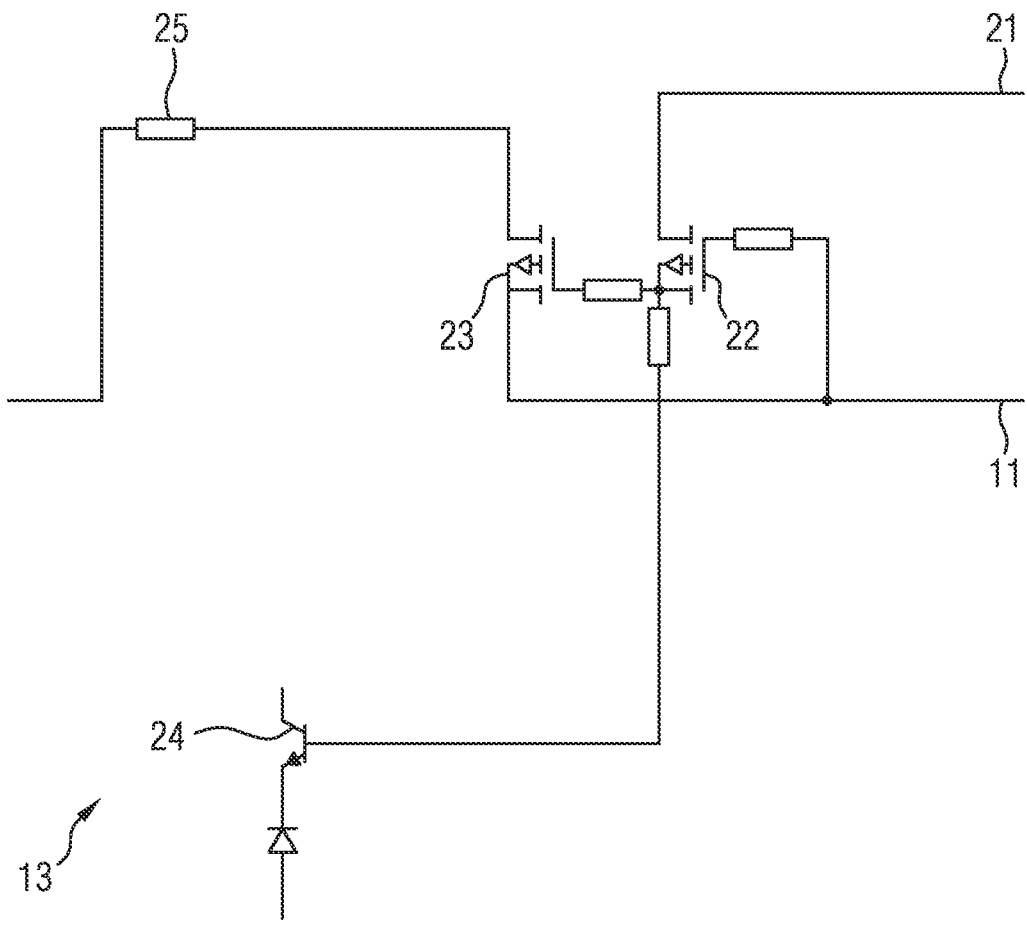
FIG. 4 shows another part of the circuit shown in FIG. 2.

In addition to the amplifier circuit 12, the voltage follower 8 also includes a bypass circuit 13, which is shown in isolation in FIG. 4. This has the task of bypassing the amplifier circuit 12 when the voltage measuring device 6 is not in the waking state. This is advantageous because the amplifier circuit 12 would always draw a certain supply current for the voltage divider, resulting from the supply voltage that is applied, regardless of the output current. In order to save energy and protect the battery cells 3, an activation signal 21 is therefore provided that can have either a high level 5 V above the output signal or a low level at the output signal.

The activation signal 21 is used to activate and deactivate the amplifier circuit 12. If the activation signal 21 is low, the bypass circuit 13 is active and the amplifier circuit 12 is inactive. If the activation signal 21 is high, the amplifier circuit 12 is active and the bypass circuit 13 is inactive.

If the voltage measuring device is in the waking state, the activation signal is high (e.g. 5V) and the transistor 22, which is in the form of a p-channel MOSFET, the gate terminal being connected to ground and the source terminal being connected to the activation signal 21, has a voltage of −5V between the gate and the source and is therefore on. When the transistor 22 is on, the transistor 23, which is also in the form of a p-channel MOSFET, has a voltage of +5V between the gate and the source and is therefore off. The bipolar transistor 24 connects the amplifier circuit 12 to the negative pole 18 of the supply voltage; the amplifier circuit 12 is therefore active.

If the voltage measuring device 6, 6', 6", 6'" is in the sleeping state, the activation signal 21 is at the level of the output signal, i.e. at ground for the voltage measuring device 6, 6', 6", 6'". In this case, transistor 22 is off. The transistor 23 is on, however, and connects the output 11 to the input 10 via the resistor 25, with the result that the amplifier circuit 12 is bypassed.

A number of implementations have been described. Nevertheless, it will be understood that various modifications may be made without departing from the spirit and scope of the disclosure. Accordingly, other implementations are within the scope of the following claims.

LIST OF REFERENCE SIGNS 1 battery
2 cell stacks
3 battery cell
4, 4', 4", 4' pack
5 device
6, 6', 6", 6"" voltage measuring device
7 measuring line
8, 8', 8" voltage follower
9 reference voltage
10 input
11 output
12 amplifier circuit
13 bypass circuit
14 bipolar transistor
15 bipolar transistor
16 resistor
17 resistor
18 negative pole
19 diode
20 diode
21 activation signal
22 transistor
23 transistor
24 bipolar transistor
25 resistor

What is claimed is:

1. A device for determining cell voltages across series-connected battery cells of a cell stack, the battery cells being combined to form packs including a plurality of series-connected battery cells, the device comprises:
    a voltage measuring device associated with each pack for determining the cell voltages of each battery cell of the respective corresponding pack;
    a voltage follower for at least two adjacent packs, the voltage follower connected to a current path between two adjacent packs, the voltage follower receiving a potential of the one pack as an input signal and a reference voltage; and
    providing a supply voltage for the voltage measuring device of the other pack at low impedance as an output signal,
    wherein the voltage follower has a bypass circuit and an amplifier circuit, through which there are alternative flows during operation.

2. The device of claim 1, further comprising an upstream voltage follower for the voltage follower of each pack from the second pack to the last pack.

3. The device of claim 1, wherein the amplifier circuit has a power stage having two complementary bipolar transistors, and a base stage having two diodes, which are each connected upstream of the base of the bipolar transistors, with a result that they shift the operating points of the bipolar transistors.

4. The device of claim 1, wherein the voltage follower has an input for an activation signal that can be used to activate the bypass circuit and to deactivate the amplifier circuit when the associated voltage measuring device changes from a waking state to a sleeping state.

5. A battery for an electrically operated vehicle, the battery comprising:
    at least a number of series-connected battery cells of a cell stack,
    multiple packs including combined battery cells and including a plurality of series-connected battery cells, and
    a device for determining cell voltages of the series-connected battery cells, the device comprising:

a voltage measuring device associated with each one of the packs for determining the cell voltages of each battery cells of the respective corresponding pack;

a voltage follower for at least two adjacent packs, the voltage follower connected to a current path between two adjacent packs, the voltage follower receiving a potential of the one pack as an input signal and a reference voltage, and providing a supply voltage for the voltage measuring device of the other pack at low impedance as an output signal; and an upstream voltage follower for the voltage follower of each individual pack from the second pack to the last pack.

6. The device of claim 5, wherein the voltage follower has a bypass circuit and an amplifier circuit, through which there are alternative flows during operation.

7. The device of claim 6, wherein the amplifier circuit has a power stage having two complementary bipolar transistors, and a base stage having two diodes, which are each connected upstream of the base of the bipolar transistors, with a result that they shift the operating points of the bipolar transistors.

8. The device of claim 6, wherein the voltage follower has an input for an activation signal that can be used to activate the bypass circuit and to deactivate the amplifier circuit when the associated voltage measuring device changes from a waking to a sleeping state.

9. A method for determining cell voltages across series-connected battery cells of a cell stack, the method comprising:

providing multiple packs including a plurality of series-connected battery cells; and determining the cell voltages of each individual battery cell of the respective pack by way of a voltage measuring device associated with each pack;

wherein a voltage signal provided at high impedance from a potential of a pack is used in impedance-converted form as a supply voltage for the voltage measuring device of the adjacent pack, and wherein the impedance conversion is only performed when the associated voltage measuring device is in a waking state.

10. The method as claimed in claim 9, wherein the impedance conversion is performed by a voltage follower.

* * * * *